United States Patent
Li

(10) Patent No.: US 6,503,822 B2
(45) Date of Patent: *Jan. 7, 2003

(54) METHODS FOR INSITU PLASMA PRE-DEPOSITION WAFER TREATMENT IN CHEMICAL VAPOR DEPOSITION TECHNOLOGY FOR SEMICONDUCTOR INTEGRATED CIRCUIT APPLICATIONS

(75) Inventor: Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/828,110

(22) Filed: Apr. 6, 2001

(65) Prior Publication Data

US 2001/0012685 A1 Aug. 9, 2001

Related U.S. Application Data

(62) Division of application No. 09/505,608, filed on Feb. 17, 2000, which is a continuation of application No. 09/023,523, filed on Feb. 13, 1998, now Pat. No. 6,136,690.

(51) Int. Cl.$^7$ ........................................... H01L 21/4763
(52) U.S. Cl. ...................... 438/617; 438/622; 438/637; 438/638; 438/639; 438/640
(58) Field of Search ................................. 438/617, 622, 438/637, 638, 639, 640, 700, 710

(56) References Cited

U.S. PATENT DOCUMENTS

| 4,540,607 A | 9/1985 | Tsao |
| 5,489,552 A | 2/1996 | Merchant et al. |
| 5,572,072 A | 11/1996 | Lee ............................ 257/751 |
| 5,618,382 A | 4/1997 | Mintz et al. |
| 5,627,105 A | 5/1997 | Delfino et al. |
| 5,733,816 A | 3/1998 | Iyer et al. |
| 5,789,318 A | 8/1998 | Delfino et al. |
| 5,920,122 A | 7/1999 | Matsumoto et al. ........ 257/764 |
| 6,013,575 A | 1/2000 | Itoh |
| 6,033,990 A | 3/2000 | Kishimoto et al. ......... 438/710 |
| 6,174,796 B1 * | 6/2001 | Takagi et al. ............... 438/622 |

* cited by examiner

*Primary Examiner*—David Nelms
*Assistant Examiner*—Renee R. Berry
(74) *Attorney, Agent, or Firm*—TraskBritt

(57) ABSTRACT

A method of de-oxidizing a surface onto which a refractory metal or molecule which contains a refractory metal atom will be adhered. The method utilizes a plasma which includes a gas such as argon, nitrogen, helium or hydrogen, or a mixture of any of the foregoing, to remove oxygen molecules from the surface to which adherence of the refractory metal is desired. Radicals in the plasma coat the surface to prevent further oxidation thereof. The method also includes techniques for depositing refractory metals onto a surface such as a substrate or layer of semiconductor material on which integrated circuitry has been fabricated.

19 Claims, 7 Drawing Sheets

METHODS FOR INSITU PLASMA PRE-DEPOSITION WAFER TREATMENT IN CHEMICAL VAPOR DEPOSITION TECHNOLOGY FOR SEMICONDUCTOR INTEGRATED CIRCUIT APPLICATIONS

CROSS REFERENCE TO RELATED APPLICATIONS

This application is a divisional of application Ser. No. 09/505,608 filed Feb. 17, 2000, pending, which is a continuation of application Ser. No. 09/023,523, filed Feb. 13, 1998, now U.S. Pat. No. 6,136,690, issued Oct. 24, 2000.

BACKGROUND OF THE INVENTION

1. Field of the Invention

The present invention relates to metallization techniques which utilize a plasma to treat a surface to which metal will be applied. Particularly, the present invention relates to plasma treatment of the surface of a semiconductor integrated circuit and the subsequent metallization of that surface. More particularly, the technique of the present invention is useful for placing refractory metals, refractory metal nitrides, and refractory metal silicon nitrides on a semiconductor die. A preferred metal for use in the technique of the present invention is tungsten.

2. Background of Related Art

Thin layers of refractory metals are desired for use in integrated circuits for several purposes, including, without limitation, as low resistance gate interconnections in polysilicon gate regions of field-effect transistors, to form a Schottky-barrier, to form ohmic contacts on silicon, as low resistance vias, and others. As line widths in very large scale integrated circuits (VLSI) decrease, the use of refractory metals in such circuits becomes increasingly desirable.

Traditionally, refractory metals for VLSI applications have been deposited by sputtering, evaporation, and chemical vapor deposition (CVD) onto the active surface of a wafer, or semiconductor substrate, including without limitation silicon, gallium arsenide, silicon on sapphire (SOS), silicon on insulator (SOI), silicon on glass (SOG), and other wafers known in the art. Although it is possible to sputter almost any material, including without limitation pure refractory metals and refractory metal silicides, sputtering machines tend to be complicated and tend to require considerable maintenance. Sputtering also tends to deposit refractory metals and their suicides in an inconsistent manner which leaves pinholes and other discontinuities in the deposited layer (i.e., sputtered films are not conformal).

Evaporation techniques for depositing refractory metals have many of the same deficiencies as sputtering techniques. Specifically, evaporative deposition of refractory metals is often a complex process. Many techniques which deposit refractory metals by evaporation also provide poor refractory metal coverage.

Relative to sputtering and evaporation techniques, chemical vapor deposition and low pressure chemical vapor deposition (LPCVD) of refractory metals often provide good coverage with reduced system complexity. However, many CVD techniques are somewhat undesirable in that the layers of refractory metals formed thereby are inadequate for some uses in integrated circuits. Many CVD techniques also deposit inconsistent, discontinuous layers of refractory metal. It is also difficult to reproduce the thickness of the refractory metal films produced by some existing CVD techniques.

U.S. Pat. No. 5,540,607, issued to Tsao (the "'607 Patent"), describes a method for treating the surface of a field-effect transistor or a Schottky barrier diode. The technique of the '607 Patent utilizes a plasma etch such as $CF_4 + 4\% O_2$ to shape doped polysilicon regions. According to the method of the '607 Patent, the polysilicon surface is then treated with a low power argon plasma to enhance nucleation sites on that surface. A layer of tungsten or molybdenum is then selectively deposited on the treated surface by CVD techniques.

Although the method of the '607 Patent enhances the nucleation sites on a polysilicon or silicon surface, the refractory metal which is subsequently deposited by the reaction of $WF_6$ with silicon may cause wormholes, which decreases the selectivity of refractory metal deposition. The refractory metal layer may also have an inconsistent thickness (i.e., poor uniformity).

U.S. Pat. No. 5,618,382, issued to Mintz et al. (the "'382 Patent"), describes an apparatus which, among other things, employs a plasma to etch a substrate. The apparatus operates at high frequencies (greater than 13.56 MHZ), preferably in the range of 30 to 200 MHZ, depending upon the process to be performed on the wafer. The purpose of the apparatus disclosed in that patent is to increase the rate of plasma processing of semiconductor wafers without significant damage thereto. The '382 Patent does not disclose use of the apparatus to deposit refractory metals onto a semiconductor die, nor does the '382 Patent disclose improved adherence of a refractory metal layer to a semiconductor die following plasma surface etching.

In integrated circuit manufacturing, blanket deposition of tungsten is typically favored over selective deposition of the same due to difficulties in controlling selectivity loss. Blanket deposition inherently requires that the tungsten be deposited onto both silicon/polysilicon and oxide surfaces. Typically, prior to the blanket deposition of tungsten, multiple layers including titanium (Ti) and titanium nitride (TiN) are deposited onto the silicon and/or polysilicon surfaces prior to the deposition of more desirable refractory metals such as tungsten or molybdenum. A first layer, such as a titanium film, which adheres well to silicon, polysilicon, or the like, is deposited directly onto such surfaces. A second layer, such as titanium nitride, which adheres well to both the first layer and to the desired refractory metal, is then deposited onto the first layer. Next, the desired refractory metal, such as titanium or molybdenum, is deposited onto the second layer. The titanium/titanium nitride layers also lower contact resistance and act as a diffusion barrier to prevent fluorine-containing species from attacking the underlying layers during subsequent deposition steps.

Although the use of such layers improves the adhesion of tungsten or other refractory metals to a die, materials such as titanium nitride oxidize very readily under ambient conditions. As those of ordinary skill in the relevant art are aware, refractory metals do not adhere well to oxides. Thus, an oxidized surface of the second layer hinders the ability of the desirable refractory metal to form a contiguous film which will adequately adhere to the second layer (i.e., causes less uniform nucleation and increases the length of time that is required to form a contiguous film).

A method is needed in the art for decreasing or eliminating oxidation on a substrate prior to metallization, so as to improve the adhesion of refractory metals, refractory metal nitrides and refractory metal silicon nitrides to the substrate. A method for producing a more contiguous, uniform layer of refractory metal in a reduced period of time is also needed.

Further, a method is needed which reduces the incidence of spontaneous fluorine attack of the substrate material.

BRIEF SUMMARY OF THE INVENTION

The method of the present invention addresses each of the foregoing needs.

As used herein, the term "refractory metals" means refractory metals, refractory metal nitrides, refractory metal silicon nitrides, and other molecules and materials which include refractory metal atoms. The terms "wafer" and "semiconductor substrate", as used herein, refer to semiconductor wafers formed from silicon, polysilicon, gallium arsenide, silicon on glass (SOG), silicon on insulator (SOI), silicon on sapphire (SOS) and others known in the art.

According to the method of the present invention, one or preferably more layers of base material are adhered to a semiconductor substrate material prior to deposition of a refractory metal layer thereover. Each of the layers of base material between the substrate and the refractory metal adhere well to both of the adjacent layers. Preferably, the upper, exposed base layer includes a material to which a desired refractory metal layer adheres well. A plasma is then generated over the upper base layer to reduce the level of oxidation thereon and to facilitate the subsequent deposition of a refractory metal, such as tungsten. Preferably, the plasma gas includes a mixture of argon, hydrogen and nitrogen. The impact of argon against the titanium nitride surface may physically remove oxygen atoms from the surface or it may energize the oxygen atoms, causing them to react with the hydrogen radicals in the plasma. A layer of refractory metal is then applied to the upper base layer. Preferably, the refractory metal is deposited onto the substrate in situ by CVD techniques immediately following the removal of oxygen from the base layer surface over the substrate.

The present invention includes a method for treating an exposed, upper base layer onto which a refractory metal such as tungsten, molybdenum, or another refractory metal or metal alloy is to be applied. An argon-hydrogen-nitrogen plasma is generated over the base layer. Argon molecules in the plasma collide with the exposed surface of the upper base layer and remove oxygen atoms therefrom. Hydrogen and nitrogen radicals coat or "stuff" the upper base layer surface to prevent further oxidation thereof.

The present invention also includes a method for reducing oxidation on the layer upon which the refractory metal layer is to be deposited, further improving the adherence of the refractory metal to that layer.

The method of the present invention is useful for forming conductive structures in semiconductor devices, including without limitation electrical contacts, such as bond pads, via fills, gates, and local and global interconnections.

Advantageously, the present invention provides a method to form a contiguous, consistent layer of refractory metal film on the exposed surface of a substrate. The method of the present invention includes a first chemical vapor deposition (CVD) step which facilitates the generation of nucleation sites, which have the thickness and confluency to form a contiguous layer on the substrate, and provide improved adhesion of the subsequently deposited refractory metal layer thereto. The preferred method also includes a subsequent CVD step, wherein a second chemical reaction facilitates growth of nucleation centers together and consistent thickness of the film in order to increase step coverage and reduce contact resistance. Thus, the method of this invention deposits a contiguous, consistent layer of refractory metal on the substrate. The present invention also reduces the time it takes to deposit a contiguous layer of refractory metal onto the surface of a die relative to refractory metal deposition processes in the prior art.

The incidence of spontaneous fluorine etching of the substrate is also reduced by the method of the present invention. This is accomplished by excluding fluorine-containing species from the plasma, which are known by those of ordinary skill in the relevant art to etch silicon, polysilicon, silicon dioxide, and other materials, from the deoxidizing plasma. Instead, hydrogen radicals from the plasma create an excess of hydrogen, which adheres to the upper base layer surface following de-oxidation of that layer. Thus, the fluorine atoms of the deposition reaction are believed to be more likely to react with the hydrogen than with the substrate.

Other advantages of the present invention will become apparent to those of ordinary skill in the relevant art through a consideration of the appended drawings and the ensuing description.

DETAILED DESCRIPTION OF THE INVENTION

The method of the present invention includes plasma de-oxidation of surfaces of a semiconductor integrated circuit upon which refractory metal deposition is desired. Refractory metals are useful for fabricating many of the electrically conductive structures of a semiconductor device. Thus, the method of the present invention is suited for forming structures such as contacts and via fills. A preferred metallization method also includes depositing metal onto the treated layers. Since refractory metals do not adhere to oxidized surfaces and insulating layers, the method of this invention may also include the formation of a silicon dioxide (SiO$_2$) or other oxide layer on surfaces of the semiconductor substrate where refractory metal deposition is not desired. The preferred method according to the present invention also includes the formation of one or more base layers on the active surface of the semiconductor substrate to facilitate adhesion of the desired refractory metal thereto.

As those of ordinary skill in the relevant art are aware, refractory metals such as tungsten and molybdenum do not adhere well to oxides or insulating or passivation materials such as borophosphosilicate glass (BPSG), phosphosilicate glass (PSG) and others. Thus, the method of the present invention may include the formation of an insulating layer of a material such as silicon dioxide, PSG, BPSG, or another insulating material on the areas of the semiconductor substrate where refractory metal deposition is not desired. The formation and configuration of such layers are well known to those of skill in the art.

Figure 1:
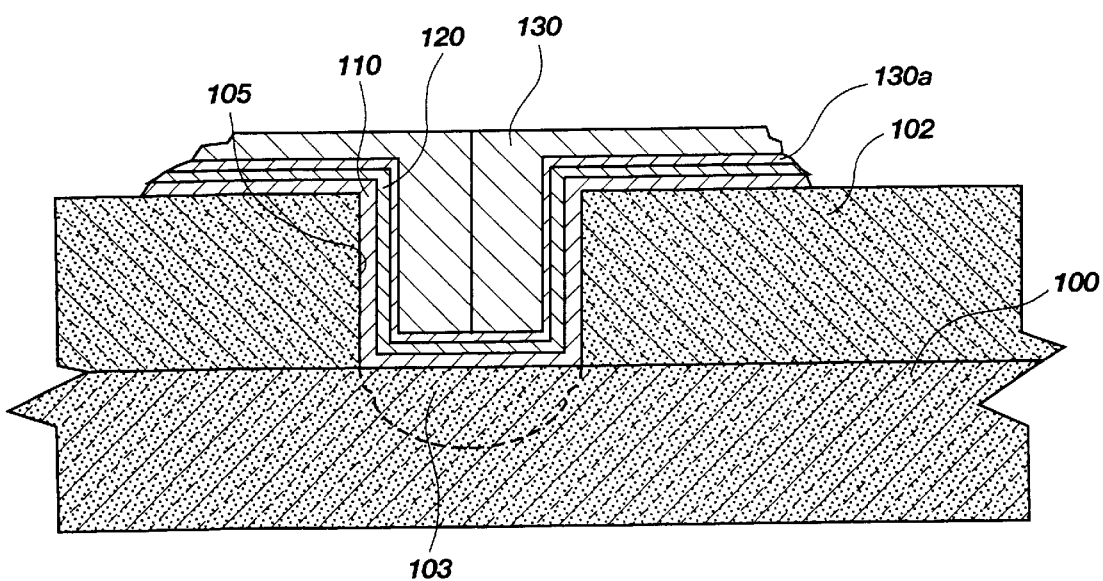
FIG. 1 is a cross-sectional view which illustrates a semiconductor substrate having base layers thereon and a refractory metal layer deposited onto the base layers to form a plug that fills a via hole.

Preferably, the refractory metal deposition technique of the present invention includes depositing one or more base layers onto the integrated circuit substrate. With reference to FIG. 1, a first base layer 110 is blanket deposited onto an oxide layer 102, such as BPSG, and the exposed semiconductor regions 103 (e.g., silicon or polysilicon) of a semiconductor substrate 100, which may be formed from a material such as silicon, polysilicon, gallium arsenide, silicon on sapphire (SOS), silicon on insulator (SOI), silicon on glass (SOG) or any other substrate material which is useful in semiconductor integrated circuit applications. First base layer 110 is preferably formed from a material which adheres well to semiconductor substrate 100 and to oxide layer 102 and has better adherence to the subsequently applied layer of refractory metal or another base material than that of the refractory metal to the substrate material. Preferably, first base layer 110 also improves conductivity between the underlying semiconductor regions and the refractory metal to be deposited thereover.

One or more subsequent base layers 120 may also be adhered to first base layer 110 to achieve a desired level of adhesion of a refractory metal plug 130 to the semiconductor substrate 100. Preferably, each subsequent base layer 120 adheres well to the underlying base layer 110 or to another, lower base layer. Preferably, each subsequent base layer 120 also has better adherence to the next applied layer, which is referred to as a plug 130, than plug 130 has to either the preceding, first base layer 110 to semiconductor substrate 100, or to oxide layer 102. The uppermost base layer 120 is also referred to herein as the upper base layer, the exposed base layer, and the deposition layer. Preferably, uppermost base layer 120 also acts as a diffusion barrier in order to prevent fluorine-containing species from attacking the underlying layers during subsequent deposition steps.

Figure 1A:
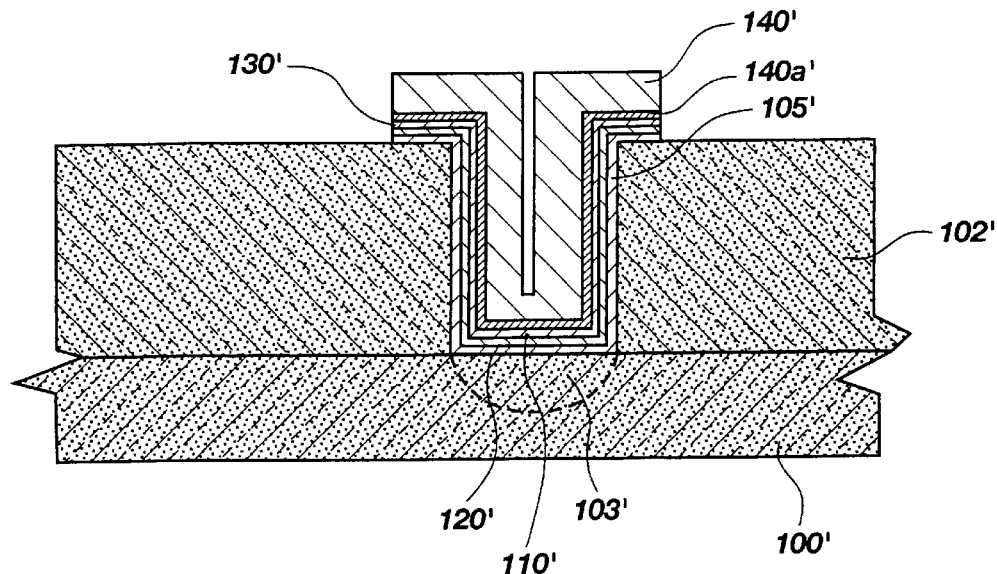
FIG. 1a is a cross-sectional view which illustrates a semiconductor substrate including a via plug which has a different number of base layers than that of FIG. 1.

In FIG. 1, plug 130 is made of refractory metal. However, in applications where more than two base layers are necessary to obtain the desired adhesion of a refractory metal to the semiconductor substrate, as shown in FIG. 1a, a plug 140' must be deposited on another subsequently deposited base layer 130'. Methods which are known to those of ordinary skill in the relevant art are useful in the present invention for depositing each of the base layers onto the substrate and on top of one another.

Figure 1B:
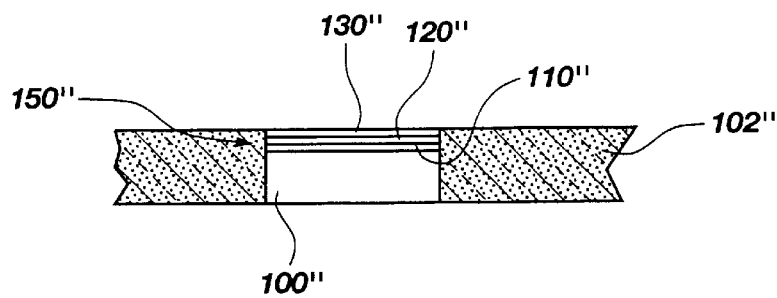
FIG. 1b is a cross-sectional view which illustrates a semiconductor substrate having a bond pad thereon including first and second base layers and a refractory metal layer.

FIGS. 1 and 1a illustrate plugs 130 (FIG. 1) and 140'/140a' (FIG. 1a) fabricated from a refractory metal which fill via holes 105 and 105', respectively. Plugs 130 and 140' are formed over one or more base layers (a first base layer 110 and a second base layer 120 in FIG. 1 and first, second and third base layers 110', 120' and 130', respectively in FIG. 1a). FIG. 1b depicts a bond pad 150" that has been fabricated on a semiconductor substrate 100". Bond pad 150" includes a first base layer 110", a second base layer 120" disposed on the first base layer, and an exposed refractory metal layer 130".

Figure 1C:
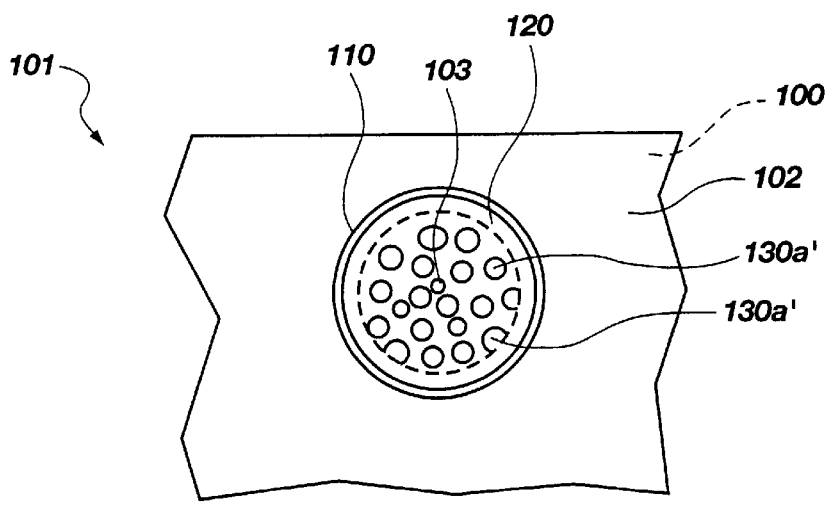
FIG. 1c is a top plan view of a semiconductor device including a semiconductor substrate, a first base layer disposed thereon, a second base layer disposed on the first base layer, and a refractory metal layer disposed over the second base layer, the first and second base layers and the refractory metal layer forming a bond pad.

Referring now to FIG. 1c, a semiconductor device 101 that is an intermediate product of the process of the present invention is shown. Semiconductor device 101 includes a semiconductor substrate 100 having a field oxide layer 102 thereon, a first base layer 110 deposited on the field oxide layer, a second base layer 120 disposed over the first base layer, and a plurality of discontinuous refractory metal nucleation centers 130a' on the second base layer 120.

Figure 1D:
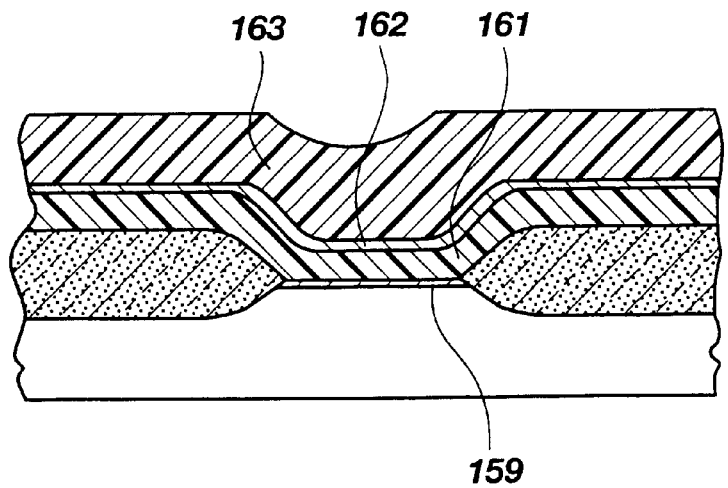
FIGS. 1d and 1e are cross-sectional views which illustrate a wordline gate after the refractory metal deposition and after a dry etch to define the gate.
Figure 1E:
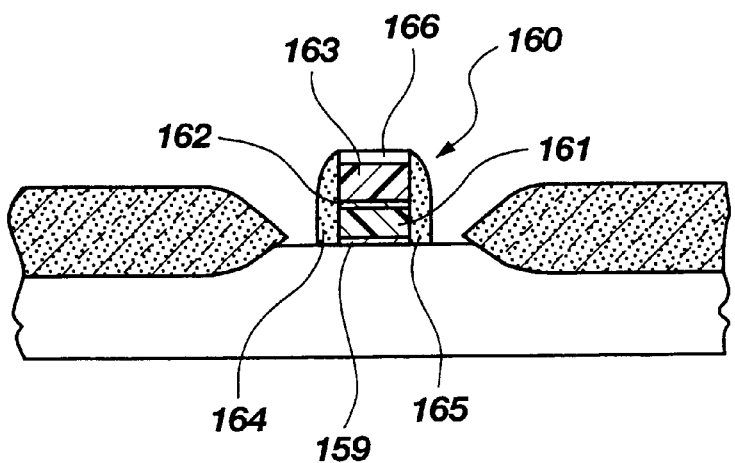

FIGS. 1d and 1e illustrate the fabrication of a wordline 160 that has been fabricated over a gate oxide layer 159 by the process of the present invention. Wordline 160 includes a polysilicon layer 161, a titanium nitride layer 162 and a tungsten layer 163. Following deposition of each of the gate oxide layer 159, polysilicon layer 161, titanium nitride layer 162 and tungsten layer 163, an etch is conducted as known in the art in order to define wordline 160. Using processes that are known in the art, a gate may then be formed over wordline 160 by fabricating spacers 164 and 165 adjacent to wordline 160 and depositing a cap 166 on the same.

When improved adhesion of tungsten to a surface of semiconductor substrate 100 is desired, layer 110 preferably comprises titanium (Ti), layer 120 preferably comprises titanium nitride (TiN), and plug 130 is tungsten. Titanium adheres well to silicon, titanium nitride adheres well to titanium, and tungsten adheres better to titanium nitride than to either silicon or titanium. Thus, the use of a titanium nitride base layer facilitates the successful deposition and longevity of the overlying tungsten layer.

It is well known to those of ordinary skill in the art that refractory metals do not adhere well to oxidized surfaces. However, materials such as titanium nitride, silicon, polysilicon, and others are known to oxidize readily under ambient conditions. Thus, the method of the present invention includes a technique for reducing oxidation on the surfaces to which refractory metal deposition is desired.

A treatment, or de-oxidation, method according to the present invention includes plasma treatment of the surface to which refractory metal deposition is desired. A plasma is generated over the exposed base layer to remove oxygen molecules from the exposed base layer (e.g., a TiN base layer 120) and prevent further oxidation from occurring prior to deposition of the refractory metal layer upon the exposed base layer. The ions, radicals, neutral-active species, molecules and atoms in the plasma treat the exposed base layer and coat the exposed surface of the base layer to prevent further oxidation thereof.

Plasma gas mixtures which are useful in the present invention include a primary carrier gas or mixture which is capable of removing scavenging oxygen atoms from the exposed base layer and a secondary gas which prevents further oxidation of the exposed base layer. Suitable primary carrier atoms, such as argon (Ar), are massive enough to impart sufficient momentum in a plasma to remove oxygen molecules from the exposed base layer. Other elements which are useful in the plasma gas mixture include, but are not limited to, nitrogen (N$_2$), small amounts of helium (He), and other inert gases. Mixtures of any of the foregoing are also useful in the carrier gas. A preferred carrier gas mixture which is useful as a precursor gas in the formation of the de-oxidizing plasma includes two parts by volume argon and one part by volume nitrogen.

A preferred secondary gas, such as hydrogen ($H_2$), prevents further oxidation of the exposed base layer (i.e., inhibits the ability of oxygen to reacting with the exposed base layer). Gases which comprise other inert elements that will coat the exposed base layer to prevent further oxidation thereof are also useful as the secondary gas.

Preferably, plasma de-oxidation according to the present invention is conducted in a CVD chamber having plasma capability of the type used in the industry, including, but not limited to, single wafer reactors, horizontal tube reactors, parallel plate reactors, and PECVD reactors. Plasma sources which are useful in the present invention include, without limitation, radio frequency (RF) plasma sources, microwave plasma sources, remote plasma sources, and other plasma sources as known in the art.

In a preferred embodiment of the plasma de-oxidation technique of this invention, oxygen is first evacuated from the deposition chamber. Nitrogen, argon, helium, hydrogen or a mixture of any of the foregoing may be pumped into the deposition chamber to assist in the evacuation of oxygen therefrom. A carrier gas or gas mixture is then flowed into the plasma chamber at a rate of from about 0 to about 300 standard cubic centimeters per minute (sccm). Continuing with the above example, where the carrier gas includes a mixture of argon and nitrogen, argon enters the chamber at a rate of from about 0 to about 200 sccm and nitrogen enters the chamber at a rate in the range of from about 0 to 100 sccm. The secondary gas preferably flows into the reactor at a rate of from about 250 to about 450 sccm. Preferably, the plasma gases flow into the reactor chamber until the pressure within the reactor chamber is in the range of about 0.45 torr to about 0.90 torr. In RF plasma systems, a preferred power range of about 100 to 300 watts is used to energize the plasma. Spacing between susceptor and showerhead is preferably in the range of about 700 mil to about 900 mil. Preferably, the duration of the plasma de-oxidation step is from about 5 to about 15 seconds.

Energetic species, such as the radicals present in the plasma, are adsorbed onto the surface of the exposed base layer. When argon/hydrogen or argon/nitrogen/hydrogen plasma gases are used, the hydrogen radicals of the plasma tend to adsorb to the exposed base layer. It is known to those of ordinary skill in the art that radicals tend to have high sticking coefficients, and also appear to migrate easily along the surface after adsorption thereto. These factors facilitate the formation of a hydrogen coat which has good conformality over the exposed surface of the upper base layer. The presence of a hydrogen coat on the exposed surface of the upper base layer accelerates refractory metal deposition on that surface.

Following plasma de-oxidation of the deposition layer, the refractory metal is applied to the exposed base layer. The preferred method of refractory metal deposition for use in the technique of the present invention is chemical vapor deposition (CVD). However, other metallization techniques which are known to those of ordinary skill in the relevant art are also useful in the present invention, although currently not as preferred. Such metallization techniques include, without limitation, evaporation, sputtering, and others.

When the desired refractory metal is applied to the integrated circuit by CVD, the refractory metal is first nucleated onto the deposition layer, then blanket deposited thereon. Preferably, nucleation and blanket deposition immediately follow the de-oxidation step and occur in the same CVD chamber. Thus, plasma de-oxidation and refractory metal deposition preferably occur in situ without physical transfer of the semiconductor substrate to another location or chamber. However, in the preferred embodiment of the present invention, deposition of the refractory metal need not be plasma-enhanced.

As noted above, the presence of hydrogen on the exposed base layer has been found to accelerate nucleation and decrease the reaction incubation time which is necessary to form a refractory metal film of desired thickness. Hydrogen also reacts with fluorine molecules in the plasma, inhibiting their ability to attack the semiconductor substrate.

In practicing a preferred embodiment of the refractory metal deposition method of the invention, a carrier gas, such as argon, nitrogen, helium, or another inert gas or mixture of such gases, is flowed into the chamber until a pressure of about 0.3 to 3.0 torr is attained. The presence of such carrier gases facilitates uniform deposition of the refractory metal onto the integrated circuit. The reaction chamber is then heated to an appropriate temperature for CVD of the desired refractory metal. For example, tungsten deposition requires a temperature of approximately 300° C. to greater than 500° C.

Next, appropriate amounts of reactants necessary for deposition of the desired refractory metal are flowed into the CVD chamber. In a preferred tungsten deposition reaction, for every two molecules of tungsten hexafluoride ($WF_6$) in the chamber, three silane ($SiH_4$) molecules are flowed into the chamber. The preferred chemical reaction for forming tungsten nucleation sites, which consumes tungsten hexafluoride and silane and which is referred to as silicon reduction of tungsten hexafluoride, is:

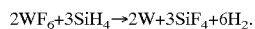

$$2WF_6 + 3SiH_4 \rightarrow 2W + 3SiF_4 + 6H_2.$$

The tungsten atoms are deposited on the exposed base layer and form nucleation sites thereon, which are also referred to herein as nucleation centers or as a tungsten nucleation layer 130a (see FIG. 1). The $SiF_4$ and hydrogen are each gaseous byproducts which are generally nonreactive with semiconductor materials. Tungsten-source gases including, without limitation, tungsten hexachloride ($WCl_6$) and others are also useful in the method of the present invention. Similar chemical reactions are useful for nucleating other refractive metals onto the exposed surface. For example, molybdenum could be nucleated onto the exposed base layer by the following equation:

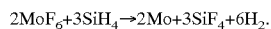

$$2MoF_6 + 3SiH_4 \rightarrow 2Mo + 3SiF_4 + 6H_2.$$

At the outset of the deposition, the carrier gas is Ar. After the silane reduces $WF_6$, hydrogen gas ($H_2$) is preferably added to the gas flow and Ar flow is stopped to shift the deposition reaction to a hydrogen reduction of $WF_6$ in accordance with the following chemical reaction:

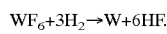

$$WF_6 + 3H_2 \rightarrow W + 6HF.$$

Hydrogen reduction of $WF_6$ grows the nucleation centers into larger islands of refractory metal, which coalesce into a continuous film of refractory metal. This step is referred to as refractory metal deposition, or blanket deposition. As in the nucleation step above, other chemical reactions which deposit tungsten or another desired refractory metal may be used in the present step.

Figure 2:
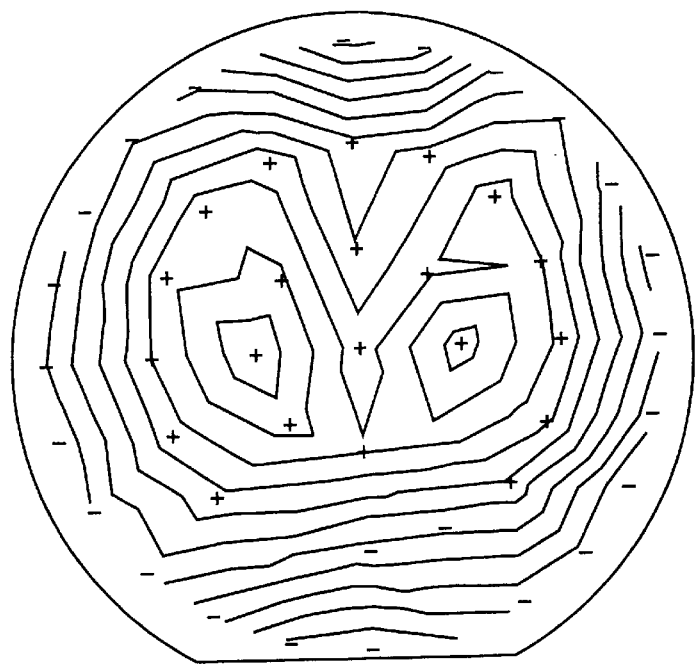
FIG. 2 is a contour map of tungsten deposited onto an untreated titanium nitride surface.
Figure 3:
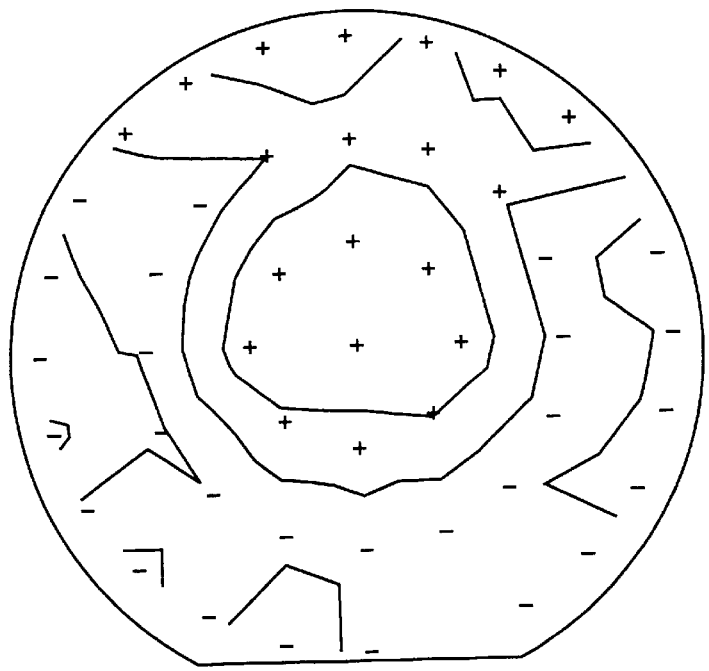
FIG. 3 is a contour map of tungsten deposited onto a titanium nitride surface which has been treated with a de-oxidizing plasma in accordance with a preferred method of the present invention.

FIG. 2 is a contour map which illustrates the surface of a tungsten layer which was chemical vapor deposited onto a titanium nitride base layer that was not treated in accordance with the present invention. FIG. 3 is a contour map which illustrates the uniformity of a chemical vapor deposited tungsten film on a titanium nitride base layer which was plasma treated in accordance with the method of the present invention. In FIGS. 2 and 3, "+" denotes areas of the tungsten layer which have a thickness greater than the average thickness of the entire layer; "−"denotes areas of the tungsten layer which have a thickness less than the average thickness of the entire layer. The contour lines correlate to changes in the thickness in the tungsten layer. As FIG. 3 shows, plasma de-oxidization of the deposition surface improves the consistency and conformity of the refractory metal layer deposited thereon.

Figure 4:
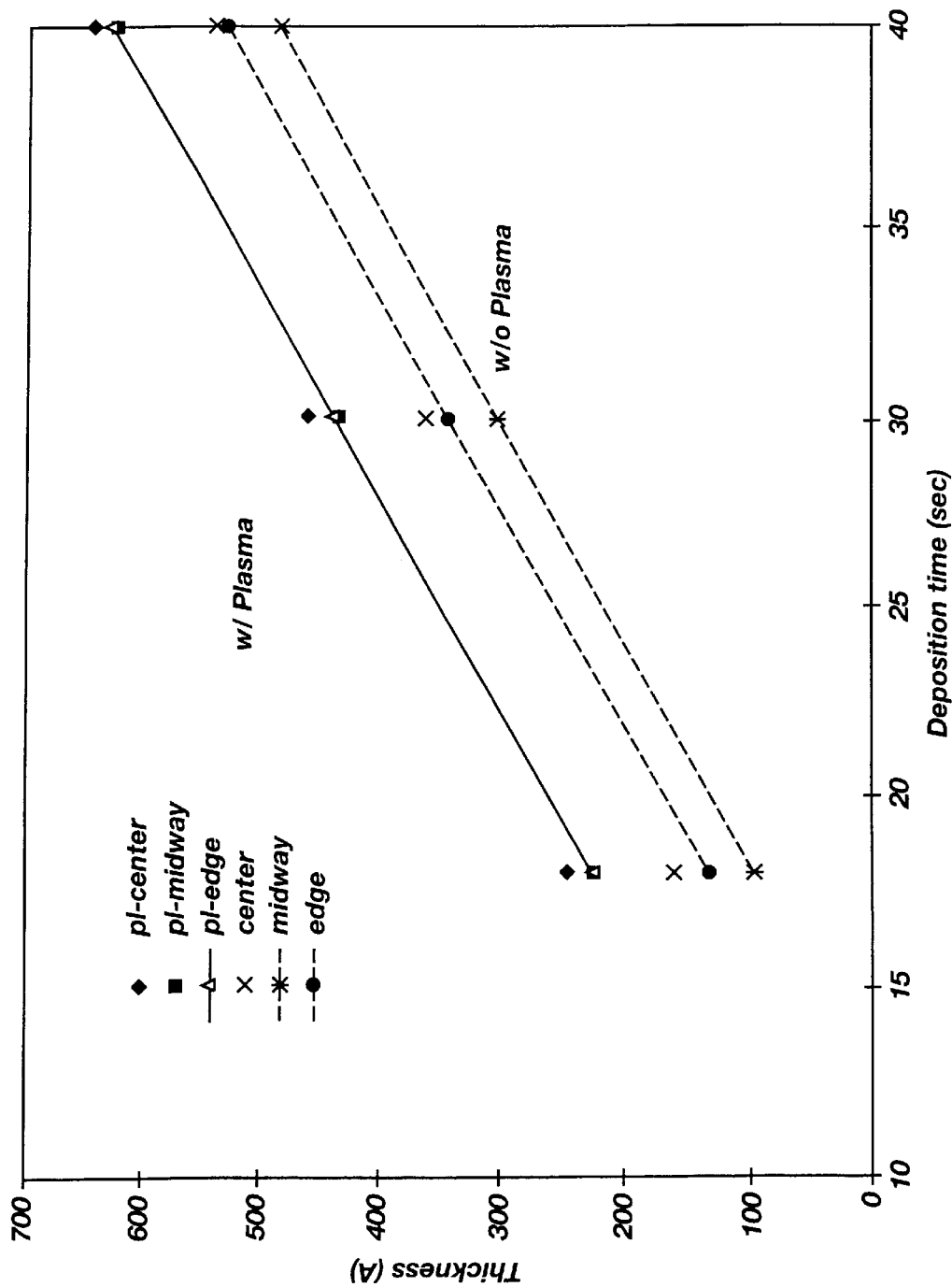
FIG. 4 is a graph which illustrates the thickness at different locations on a tungsten layer over deposition time.

FIG. 4 is a graph, the data of which was generated by a 4 point probe, which illustrates the sheet resistance, and thereby reflects the uniformity of deposited tungsten refractory metal layers on wafers over the entire surface thereof over various deposition times. The thickness of the edge, center and midway points of the tungsten layer that was deposited onto an untreated titanium nitride surface are represented by a circle, *, and X, respectively. The thickness of the edge, center and midway points of the tungsten layer that was deposited onto a plasma-treated titanium nitride surface covering a wafer are represented by a triangle, a diamond, and a square, respectively. The graph shows that the thickness of tungsten deposited onto a plasma treated surface is much more consistent than that of tungsten deposited onto an untreated surface of the same material. The graph also shows that refractory metals are deposited more quickly onto plasma treated surfaces than on untreated surfaces. Additional analysis demonstrated that the variation in layer uniformity of tungsten deposited onto an untreated titanium nitride deposition layer was about 3.3%, while the variation in uniformity of the tungsten layer that was deposited on the de-oxidized (treated) titanium nitride deposition layer improved to about 1.3%.

Figure 5:
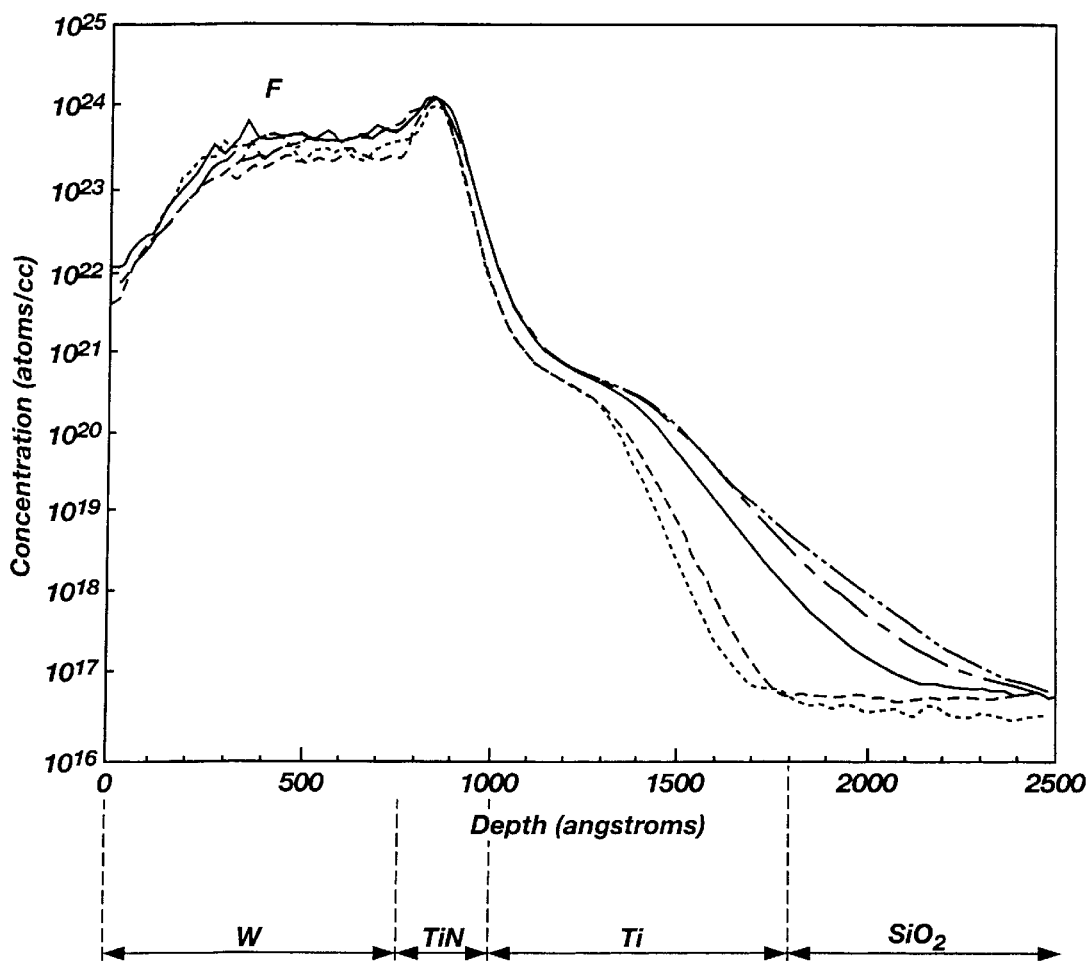
FIG. 5 is a graph which illustrates the amount of fluorine-containing species at various depths of a semiconductor device.

FIG. 5 illustrates the concentration of fluorine-containing species at the various depths of a semiconductor device. As FIG. 5 shows, the concentration of fluorine-containing species (represented by the five graph lines) drops dramatically through the titanium nitride layer and is reduced in the titanium layer (represented as "Ti") and the oxide layer (represented as "SiO$_2$") relative to the concentrations in the tungsten layer (represented as "W") and the titanium nitride layer (represented as "TiN"). Thus, FIG. 5 demonstrates that the titanium nitride layer acts as a diffusion barrier to fluorine-containing species.

Figure 6:
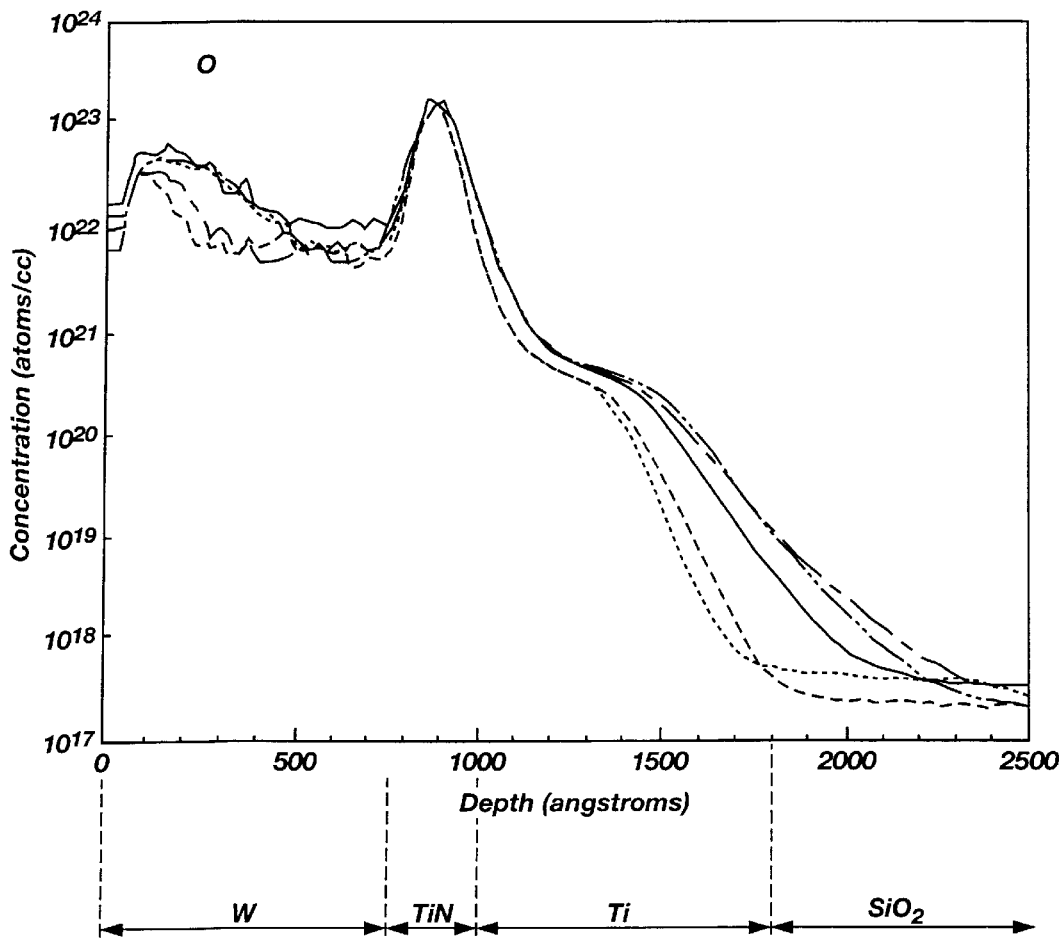
FIG. 6 is a graph which illustrates the amount of oxygen atoms at various depths of a semiconductor device.

Referring to FIG. 6, a graph is shown which illustrates the concentration of oxygen atoms at the various depths of a semiconductor device. Two of the graph lines appear below the others in the majority of the graph. These lines represent wafers which include a tungsten layer that has been deposited onto a titanium nitride layer that has been treated with an argon-hydrogen-nitrogen plasma according to an embodiment of the method of the present invention. As these graph lines illustrate, the argon-hydrogen-nitrogen plasma treatment reduces the oxygen atom concentration in the tungsten layer to about one-third that in the tungsten layer of an untreated sample (represented by the solid line).

Although the foregoing description contains many specificities, these should not be construed as limiting the scope of the present invention, but as merely providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are embraced thereby.

What is claimed is:

1. A method for deoxidizing at least a portion of a surface prior to depositing metal onto the surface, comprising exposing at least the portion of the surface to a plasma including a quantity of at least one gas selected from the group consisting essentially of argon, nitrogen, helium, and hydrogen.

2. The method of claim 1, further comprising preventing further oxidation of at least the portion of the surface prior to depositing said metal thereon.

3. The method of claim 2, wherein said preventing comprises coating at least the portion of the surface with hydrogen.

4. A method for forming a contact, comprising:

providing a semiconductor substrate;

forming a layer comprising base material over at least a portion of a surface of said semiconductor substrate;

exposing said base material to a plasma to reduce oxidation thereof; and depositing metal over said layer.

5. The method of claim 4, wherein said depositing comprises depositing tungsten.

6. The method of claim 4, wherein said exposing comprises exposing said base material to a plasma including a gas selected from the group consisting essentially of argon, nitrogen, helium, and hydrogen.

7. The method of claim 4, wherein said exposing comprises exposing said base material to a plasma including a quantity of hydrogen.

8. The method of claim 7, further comprising coating said layer with hydrogen to prevent further oxidation thereof.

9. The method of claim 4, wherein said exposing and said depositing are effected in a chemical vapor deposition chamber.

10. The method of claim 4, wherein said forming comprises depositing at least one material exhibiting greater adherence to said semiconductor substrate than to said metal.

11. The method of claim 4, wherein said forming comprises depositing at least one material exhibiting greater adherence to said metal than to material of said semiconductor substrate.

12. A method for filling a via, comprising:

providing a semiconductor substrate;

forming a layer comprising base material over at least a portion of said semiconductor substrate;

exposing said layer to a plasma to reduce oxidation of at least an exposed surface of said layer; and depositing metal over said layer.

13. The method of claim 12, wherein said depositing comprises depositing tungsten.

14. The method of claim 12, wherein said exposing comprises exposing said layer to a plasma including a gas selected from the group consisting essentially of argon, nitrogen, helium, and hydrogen.

15. The method of claim 12, wherein said exposing comprises exposing said layer to a plasma including a quantity of hydrogen.

16. The method of claim 15, further comprising coating said layer with hydrogen to prevent further oxidation thereof.

17. The method of claim 12, wherein said exposing and said depositing are effected in a chemical vapor deposition chamber.

18. The method of claim 12, wherein said forming comprises depositing at least one material exhibiting greater adherence to said semiconductor substrate than to said metal.

19. The method of claim 12, wherein said forming comprises depositing at least one material exhibiting greater adherence to said metal than to material of said semiconductor substrate.

* * * * *

UNITED STATES PATENT AND TRADEMARK OFFICE
CERTIFICATE OF CORRECTION

PATENT NO.     : 6,503,822 B2
DATED          : January 7, 2003
INVENTOR(S)    : Weimin Li It is certified that error appears in the above-identified patent and that said Letters Patent is hereby corrected as shown below:

<u>Column 1,</u>
Line 48, change "suicides" to -- silicides --

Signed and Sealed this

Nineteenth Day of August, 2003

JAMES E. ROGAN
*Director of the United States Patent and Trademark Office*